(12) United States Patent
Kajiyama et al.

(10) Patent No.: US 7,538,856 B2
(45) Date of Patent: May 26, 2009

(54) ILLUMINATION OPTICAL SYSTEM AND EXPOSURE APPARATUS INCLUDING THE SAME

(75) Inventors: Kazuhiko Kajiyama, Utsunomiya (JP); Toshihiko Tsuji, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/179,506

(22) Filed: Jul. 24, 2008

(65) Prior Publication Data

US 2009/0027641 A1  Jan. 29, 2009

(30) Foreign Application Priority Data

Jul. 27, 2007  (JP)  ............... 2007-195929

(51) Int. Cl.
G03B 27/54 (2006.01)
G03B 27/42 (2006.01)

(52) U.S. Cl. .......................................... 355/67; 355/53
(58) Field of Classification Search ................... 355/52, 355/53, 55, 67–71; 250/548; 356/399–401; 359/618–620, 857; 362/268, 269
See application file for complete search history.

(56) References Cited

U.S. PATENT DOCUMENTS

| | | | |
|---|---|---|---|
| 6,398,374 B1 * | 6/2002 | Chapman et al. | 359/857 |
| 6,504,896 B2 * | 1/2003 | Miyake et al. | 378/34 |
| 6,919,951 B2 * | 7/2005 | Tsuji | 355/67 |
| 2005/0105290 A1 | 5/2005 | Tsuji | |

FOREIGN PATENT DOCUMENTS

| | | |
|---|---|---|
| JP | 2005-141158 A | 6/2005 |
| JP | 2006-108224 | 4/2006 |

* cited by examiner

*Primary Examiner*—Hung Henry Nguyen
(74) *Attorney, Agent, or Firm*—Canon USA Inc IP Division

(57) ABSTRACT

An illumination optical system includes a first optical unit that collects light emitted from a light source; a reflective integrator that has a plurality of cylindrical reflection surfaces, whose generating lines are oriented in a uniform direction, and forms a plurality of linear light sources by using the light emitted from the first optical unit; a pair of flat mirrors that are disposed parallel to the generating lines so as to face each other with the plurality of linear light sources residing therebetween; an aperture stop that is disposed perpendicular to the generating lines and has an opening for allowing the light emitted from the plurality of linear light sources to pass therethrough; and a second optical unit that integrates beams of the light emitted from the plurality of linear light sources that have passed through the opening one on top of another in an illumination target plane.

6 Claims, 21 Drawing Sheets

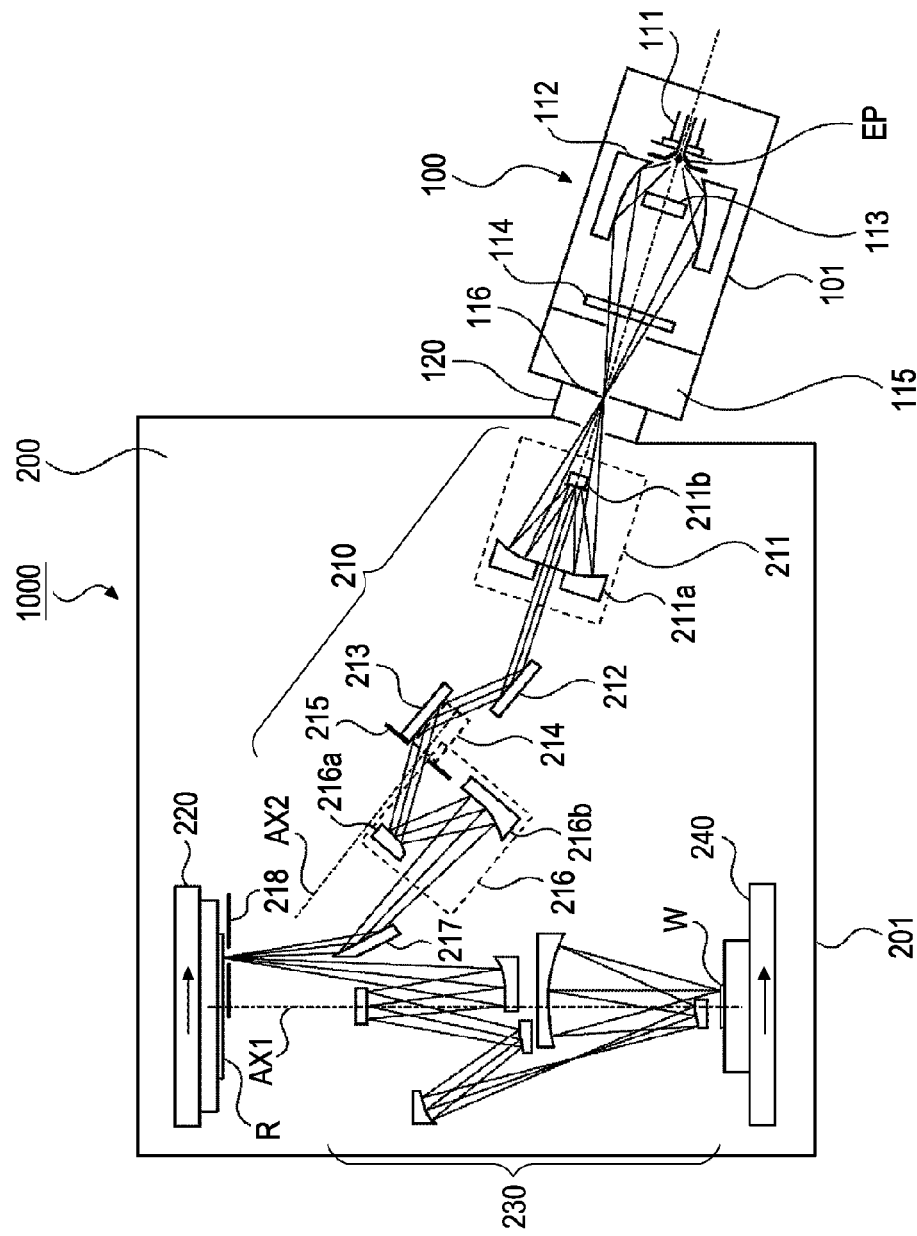

ILLUMINATION OPTICAL SYSTEM AND EXPOSURE APPARATUS INCLUDING THE SAME

BACKGROUND OF THE INVENTION

1. Field of the Invention

The present invention relates to illumination optical systems. An illumination optical system of the present invention is suitable for illumination optical systems such as those included in exposure apparatuses using exposure light of extreme ultraviolet (EUV) having a wavelength of 10 nm to 15 nm.

2. Description of the Related Art

From the viewpoint of improving the resolution, the wavelength of exposure light used in semiconductor exposure apparatuses has been becoming shorter over time. Examples of next-generation exposure apparatuses using a light source having a shorter wavelength include EUV exposure apparatuses, which uses light of the extreme ultraviolet region (EUV light) whose wavelength ranges from 10 nm to 15 nm.

Light of the extreme ultraviolet region is largely absorbed by substances, and is therefore not practical for use with dioptric systems constituted mainly by lenses. Instead, catoptric systems are used in EUV exposure apparatuses.

An exemplary illumination optical system for EUV exposure apparatuses that include catoptric systems is disclosed in Japanese Patent Laid-Open No. 2005-141158 (corresponding US Patent: US2005/105290A1). In this illumination optical system, an aperture stop having a semicircular opening is disposed on a reflective integrator. The reflective integrator disclosed in Japanese Patent Laid-Open No. 2005-141158 is an optical integrator in which a plurality of cylindrical reflection surfaces are aligned with the generating lines thereof being parallel to each other.

In exposure apparatuses, to realize formation of high-quality images with a projection optical system, it is necessary to suppress distortion in the effective light source shape, which is observed from arbitrary points on a surface to be illuminated, in an illumination optical system.

It was considered that the illumination optical system disclosed in Japanese Patent Laid-Open No. 2005-141158 realized sufficient suppression of distortion in the effective light source shape compared to known examples at the time of disclosure. However, as a result of reviews by the present inventors, it has been found that the illumination optical system of Japanese Patent Laid-Open No. 2005-141158 still has some distortion in the effective light source shape and that the degree of this distortion is not negligible. The reason for the remaining distortion in the effective light source shape of the illumination optical system disclosed in Japanese Patent Laid-Open No. 2005-141158 is because part of parallel light is regulated by the aperture stop before forming a secondary light source.

This phenomenon will be described in detail with reference to FIGS. 22 and 23. FIG. 22 is a schematic perspective view showing the arrangement of a reflective integrator 13 and an aperture stop 15 in Japanese Patent Laid-Open No. 2005-141158. FIG. 23 is a top view of the reflective integrator 13 shown in FIG. 22.

In FIG. 23, an output-side portion of a region 20 (FIGS. 22-23) (the hatched part) on the reflective integrator 13 illuminated with illuminating light IL (FIGS. 22-23) is made smaller because of the regulation of the aperture stop 15. To obtain an effective light source shape of a perfect circle at a point 31 on an end of an arcuate region 30 that is to be illuminated, a region 21 enclosed by a broken line is illuminated with the illuminating light IL.

The region 21 overlaps the region 20 on the incident side with respect to the aperture stop 15 (the lower half in FIG. 23). This means that a region that is illuminated with light to obtain an effective light source shape of a perfect circle is ensured. The excessive light outside the region 21 is regulated by the aperture stop 15. That is, in FIG. 23, the lower half of the region 21 with respect to the aperture stop 15 corresponds to the lower half of an effective light source 32, which is a semicircle having no distortion.

In contrast, on the output side with respect to the aperture stop 15 (the upper half in the top view shown in FIG. 23), there is a portion where the region 21 and the region 20 do not overlap. This causes a shift (distortion) of the effective light source 32 from the perfect circle. The portion of the region 21 that is not illuminated with light makes the effective light source 32 to be eclipsed from the perfect circle. The excessive light outside the region 21, which is free from regulation without having any stops, corresponds to a portion of the effective light source 32 outside the perfect circle.

As described above, since the illumination optical system disclosed in Japanese Patent Laid-Open No. 2005-141158 still has a slight distortion in the effective light source shape, it has become impossible for this system to accommodate recent demands for higher image-forming performance.

SUMMARY OF THE INVENTION

The present invention provides an illumination optical system capable of further suppressing distortion in the effective light source shape observed therein and thus realizing good illumination.

According to an aspect of the present invention, an illumination optical system includes a first optical unit that collects light emitted from a light source; a reflective integrator that has a plurality of cylindrical reflection surfaces, whose generating lines are oriented in a uniform direction, and forms a plurality of linear light sources by using the light emitted from the first optical unit; a pair of flat mirrors that are disposed parallel to the generating lines so as to face each other with the plurality of linear light sources residing therebetween; an aperture stop that is disposed perpendicular to the generating lines and has an opening for allowing the light emitted from the plurality of linear light sources to pass therethrough; and a second optical unit that integrates beams of the light emitted from the plurality of linear light sources that have passed through the opening one on top of another in an illumination target plane.

Further features and aspects of the present invention will become apparent from the following description of exemplary embodiments with reference to the attached drawings.

BRIEF DESCRIPTION OF THE DRAWINGS

FIG. 1 schematically shows relevant parts of an exposure apparatus according to a first embodiment of the present invention.

DESCRIPTION OF THE EMBODIMENTS

Figure 2A:
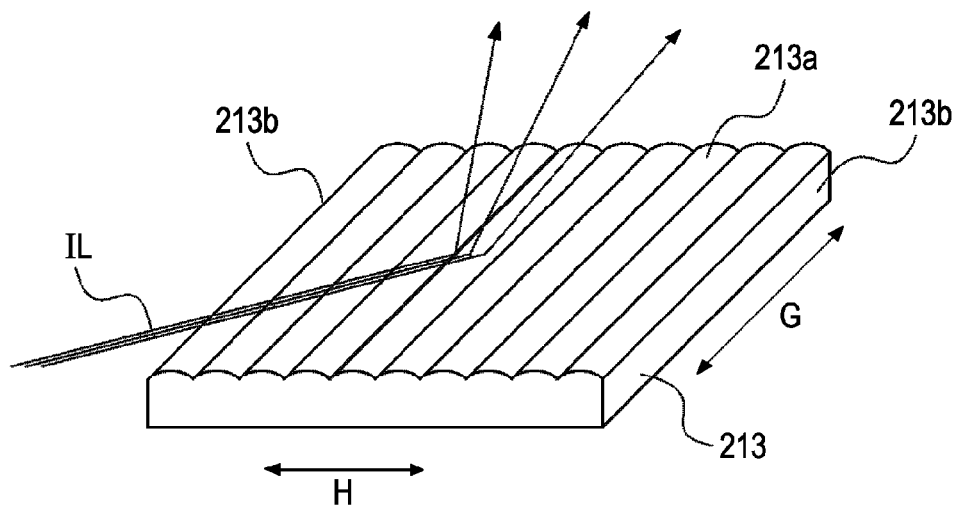
FIG. 2A schematically shows a reflective integrator.

Embodiments of the present invention will now be described with reference to the attached drawings.

First Embodiment

An exposure apparatus 1000 of a first embodiment will be described referring to FIG. 1, which schematically shows the exposure apparatus 1000.

The exposure apparatus 1000 is an EUV exposure apparatus in which a circuit pattern formed on a mask R is transferred to a wafer W by exposure, such as step-and-scan exposure, using EUV light (light having a wavelength of 13.5 nm, for example) as exposure light.

The exposure apparatus 1000 includes a light source unit 100 and a main body 200. The components of the light source unit 100 and the main body 200 are housed in vacuum containers 101 and 201, respectively. The vacuum containers 101 and 201 are connected through a connector 120. The interiors of the vacuum containers 101 and 201 and the connector 120 are kept in a vacuum state during exposure so as to prevent attenuation of the EUV light.

First, components of the light source unit 100 will be described. The light source unit 100 includes a discharging header 111, a collecting mirror 112, a debris filter 113, a wavelength filter 114, a differential pumping mechanism 115, and an aperture 116, all of which are housed in the vacuum container 101.

The collecting mirror 112 is constituted by, for example, a spheroidal mirror that collects EUV light radiated substantially isotropically from a plasma emitter EP. The debris filter 113 suppresses entrance of debris (scattered particles) into the exposure path. Debris is generated when EUV light is emitted. The wavelength filter 114 removes light of wavelengths other than the EUV light emitted from the plasma emitter EP. The differential pumping mechanism 115 performs graded reduction of the internal pressure from the vacuum container 101 toward the vacuum container 201. The aperture 116 is a pinhole-like opening provided near the light-collecting point of the collecting mirror 112. The EUV light used as exposure light travels through the aperture 116 toward the main body 200.

In the first embodiment, a discharge plasma light source is used as the light source unit 100. Alternatively, any of other EUV light sources, such as a laser plasma light source, may be used.

Next, components of the main body 200 will be described. The main body 200 includes an illumination optical system 210, a mask stage 220, a projection optical system 230, and a wafer stage 240, all of which are housed in the vacuum container 201.

The illumination optical system 210 is an illuminator that illuminates a mask R by propagating EUV light. The illumination optical system 210 includes a first optical unit 211 serving as a parallel-transformation optical system, a flat mirror 212, a reflective integrator 213, supplementary mirrors 214, an aperture stop 215, a second optical unit 216 serving as an arcuate-transformation optical system, a flat mirror 217, and a slit 218.

The first optical unit 211 is constituted by a concave mirror 211a and a convex mirror 211b. The first optical unit 211, whose focal position coincides with the light-collecting point of the collecting mirror 112, collects and transforms the EUV light traveling through the aperture 116 into parallel light. The EUV light that has entered the first optical unit 211 passes around the convex mirror 211b, is reflected at the concave mirror 211a, is reflected at the convex mirror 211b, travels as parallel light toward the reflective integrator 213, and is output from the first optical unit 211. The first optical unit 211 of the first embodiment is an optical system of a Schwarzschild type, but the first optical unit 211 is not limited thereto.

In the first embodiment, it is assumed that the plasma emitter EP is a point light source. Therefore, the light to be transformed into parallel light by the first optical unit 211 forms beams of light radiated at various angles from one point on the plasma emitter EP. This means that a surface of the integrator 213 to be illuminated by the first optical unit 211 is not conjugate with the plasma emitter EP. However, if the plasma emitter EP is of a large size, the first optical unit 211 may be configured in such a manner that the surface of the integrator 213 to be illuminated becomes conjugate with the plasma emitter EP. In that case, beams of light radiated in the same direction from points at different heights on the plasma emitter EP are transformed into parallel beams of light by the first optical unit 211. The light that is output from the first optical unit 211 is not necessarily exactly parallel, and may be slightly deviated from parallel. The light may also intentionally be controlled not to become parallel.

The flat mirror 212 is a member that deflects the light from the first optical unit 211 to the reflective integrator 213.

Figure 2B:
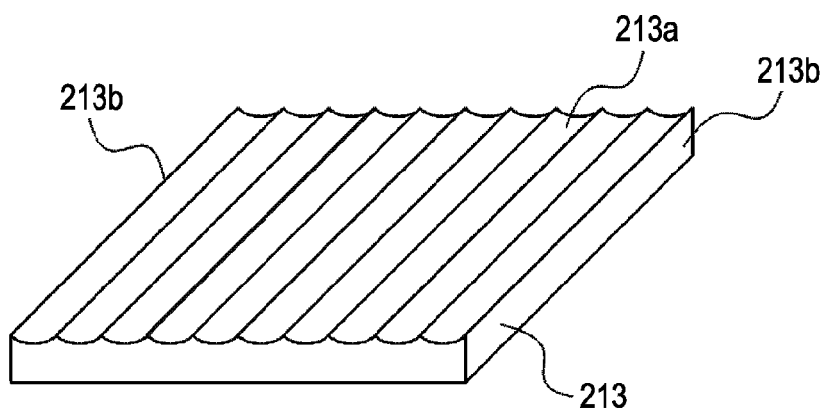
FIG. 2B schematically shows another reflective integrator.

The reflective integrator 213 forms a plurality of linear light sources by using the light that has been output from the first optical unit 211 and has been deflected by the flat mirror 212, so as to uniformly illuminate the mask R. The plurality of linear light sources function as secondary light sources. Referring to FIGS. 2A and 2B, the reflective integrator 213 has a plurality of cylindrical reflection surfaces 213a whose generating lines are oriented in a uniform direction (a direction G). FIG. 2A shows an exemplary case of convex cylindrical reflection surfaces, and FIG. 2B shows an exemplary case of concave cylindrical reflection surfaces. In FIG. 2A, the direction in which the cylindrical reflection surfaces are aligned side by side is denoted as H.

The reflective integrator 213 is provided with a pair of flat mirrors (the supplementary mirrors 214) facing each other on opposite end faces 213b of the reflective integrator 213, the end faces 213b being parallel to the direction G of the generating lines. The effect of the supplementary mirrors 214 will be described separately below in detail.

Among the light from the secondary light sources formed by the reflective integrator 213, some directly passes through an opening provided in the aperture stop 215, and some is reflected by the supplementary mirrors 214 and then passes through the opening. The opening in the aperture stop 215 defines the distribution shape of effective light sources.

The second optical unit 216 is an optical system that collects the light from the reflective integrator 213 into an arcuate shape and integrates the beams of light from the respective secondary light sources one on top of another in an illumination target plane (the mask R) by using the flat mirror 217. The second optical unit 216 includes a convex mirror 216a and a concave mirror 216b, and forms an arcuate illuminated region, which is suitable for illumination of the mask R. The flat mirror 217 is a member used for causing the light from the second optical unit 216 to be incident on the mask R at a predetermined angle.

The light beams divided by and diffusing at the cylindrical reflection surfaces of the reflective integrator 213 are collected into an arcuate shape by the second optical unit 216, and thus form an arcuate illuminated region having a uniform illuminance distribution at the opening of the slit 218 and subsequently on the surface of the mask R. The arcuate illuminated region is set in such a manner that the center of curvature thereof coincides with an optical axis (central axis) AX1 of the projection optical system 230.

Figure 6:
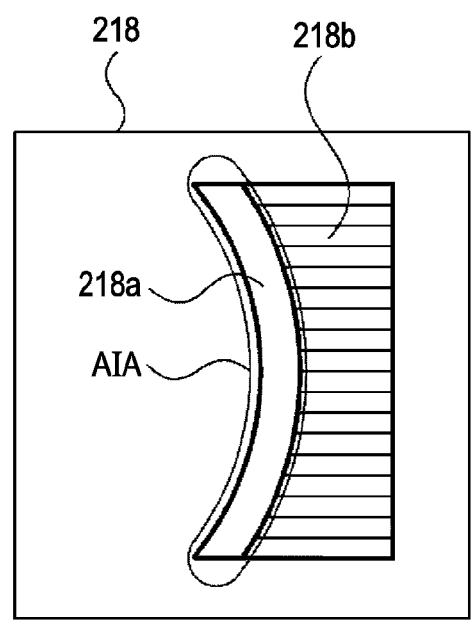
FIG. 6 is a diagram for describing an arcuate illuminated region.

The slit 218 is a member that defines a region on the mask R to be illuminated. Referring to the plan view in FIG. 6, the slit 218 has an arcuate opening 218a and movable segments 218b that individually adjust the width of the opening 218a. In FIG. 6, a region denoted as AIA is an arcuate illuminated region that is formed by the reflective integrator 213 and the second optical unit 216. The region on the mask R to be illuminated is defined by the illuminated region AIA and the opening 218a.

In scanning exposure, nonuniformity in illuminance within the opening 218a occurring in the slit longitudinal direction may cause nonuniformity in exposure. To solve this problem, the slit width is adjusted at relevant positions in the slit longitudinal direction by using the movable segments 218b. In this manner, exposure can be performed with an integrated exposure amount that is uniform over the entire exposure region. During scanning exposure, the slit 218 is static with respect to the projection optical system 230.

The mask R, which is a reflective mask, has a circuit pattern to be transferred to the wafer W. The circuit pattern is formed in a structure constituted by a multilayer reflective mirror and a non-reflective member, such as an EUV absorber, provided thereon. The mask R is mounted on the mask stage 220 with a chuck interposed therebetween, and is moved by the mask stage 220 in a direction indicated by the arrow.

The projection optical system 230 is constituted by a plurality (six, in the first embodiment) of multilayer mirrors, and is designed in such a manner that an arcuate region residing off the optical axis AX1 exhibits good image-forming performance. The projection optical system 230 is telecentric on the image side, but is non-telecentric on the object (mask R) side so as to avoid physical interference with the illuminating light to be incident on the mask R. For example, in the first embodiment, the principal beam on the object side is inclined by about 6 degrees with respect to the normal to the mask R.

The light diffracted at the mask R travels through the projection optical system 230 and reaches the wafer W. Thus, the circuit pattern formed on the mask R is reduced and projected onto the wafer W. The wafer W is mounted on the wafer stage 240 with a chuck interposed therebetween, and is moved by the wafer stage 240 in a direction indicated by the arrow. In the exposure apparatus 1000 of the first embodiment, which is a step-and-scan exposure apparatus, a circuit pattern is transferred by exposure while the mask R and the wafer W are scanningly moved by the respective stages at a speed ratio corresponding to the reduction ratio.

Figure 3:
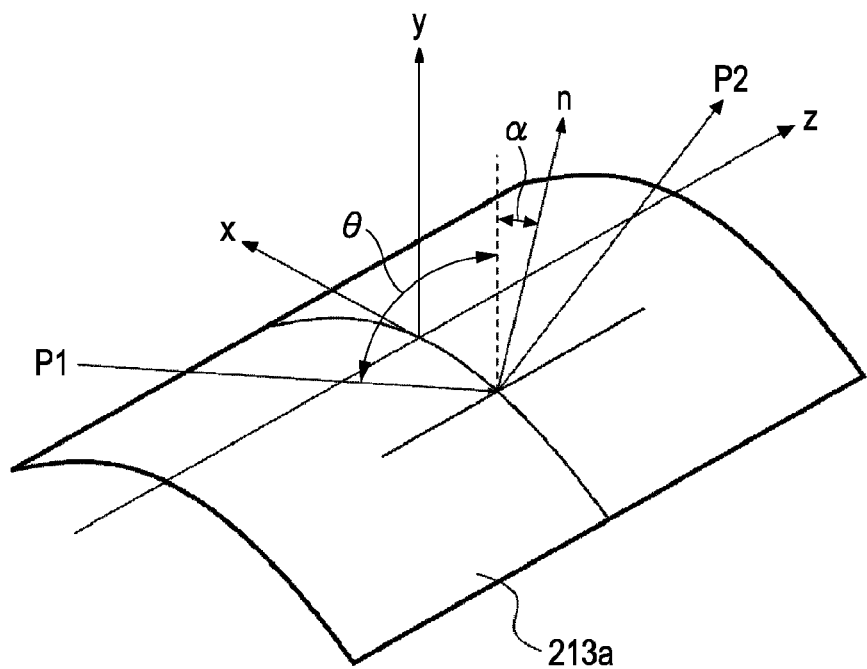
FIG. 3 is a schematic perspective view for describing the reflection of EUV light at a cylindrical reflection surface of a convex shape.
Figure 4:
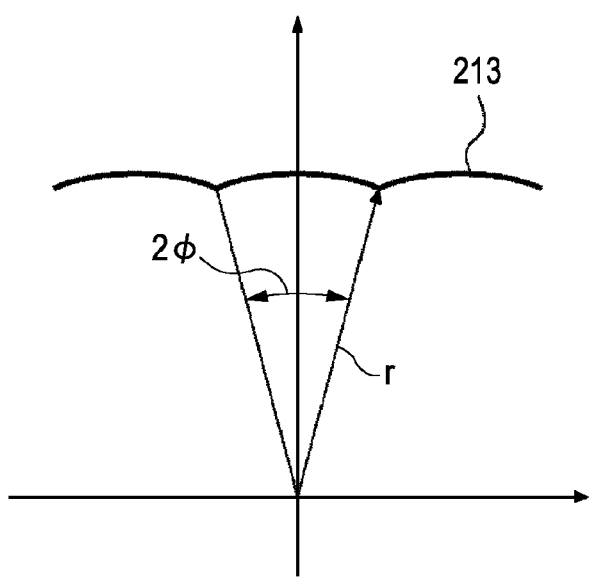
FIG. 4 is an enlarged cross-sectional view showing a part of the reflective integrator.
Figure 5:
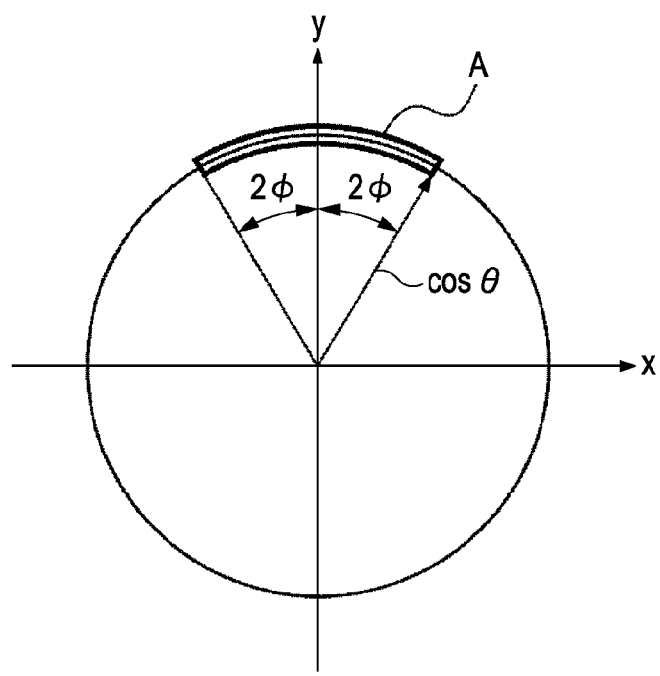
FIG. 5 shows the angular distribution of the EUV light reflected at the cylindrical reflection surface.

Next, referring to FIGS. 2A to 5, the principle of uniform illumination of an arcuate region realized by the reflective integrator 213 will be described. FIGS. 2A and 2B are, as described above, enlarged perspective views of the reflective integrator 213. FIG. 3 is a schematic perspective view for describing the reflection of EUV light at one of the cylindrical reflection surfaces 213a of a convex shape. FIG. 4 is an enlarged cross-sectional view showing a part of the reflective integrator 213. FIG. 5 shows the angular distribution of the EUV light reflected at the cylindrical reflection surface 213a.

Referring to FIG. 2A, when illuminating light IL that is parallel is incident on the reflective integrator 213 having a plurality of the cylindrical reflection surfaces 213a, linear light sources that extend in the generating-line direction G are formed near the surface of the reflective integrator 213. The angular distribution of the EUV light radiated from each of these linear light sources is represented as a conical surface. By reflecting this EUV light using the second optical unit 216, whose focal point resides at a position where the linear light sources are formed, and thus illuminating the mask R or a plane conjugate with the mask R, illumination of an arcuate shape can be realized.

As an explanation of the effect produced by the reflective integrator 213, behavior of reflected light when the illuminating light IL is incident on one of the cylindrical reflection surfaces 213a will be described referring to FIG. 3. Now, a case where the illuminating light IL is incident on one cylindrical reflection surface 213a at an angle θ with respect to a plane (an x-y plane) perpendicular to the central axis (a z axis) of the cylindrical reflection surface 213a will be considered. The beam vector of the illuminating light IL is defined as follows:

$$P1 = (0, -\cos\theta, \sin\theta)$$

The normal vector of the cylindrical reflection surface 213a is defined as follows:

$$n = (-\sin\alpha, \cos\alpha, 0)$$

Here, the beam vector of the reflected light is expressed as follows:

$$P2 = (-\cos\theta \times \sin 2\alpha, \cos\theta \times \cos 2\alpha, \sin\theta)$$

When the beam vector of the reflected light is plotted in a topological space, a circle having a radius of cos θ is obtained on the x-y plane, as shown in FIG. 5. That is, the reflected light diffuses in the shape of a conical surface. This means that a secondary light source resides near the apex of the conical surface. When the cylindrical reflection surface 213a is of a convex shape such as that shown in FIG. 2A, the secondary light source resides inside the cylindrical reflection surface 213a as a virtual image. When the cylindrical reflection surface 213a is of a concave shape such as that shown in FIG. 2B, the secondary light source resides outside the cylindrical reflection surface 213a as a real image. When the reflection surface is a portion of a cylindrical surface having a curvature radius r and has a central angle of 2φ as shown in FIG. 4, the beam vector P2 of the reflected light resides in a range of an arc A having a central angle of 4φ on the x-y plane, as shown in FIG. 5.

Next, a case where a paraboloid-of-revolution mirror having a focal length f and a focal point residing at the secondary light source is provided and an illumination target plane is positioned at a distance f from the mirror will be considered. The light emitted from the secondary light source diffuses in the shape of a conical surface. The diffusing light is reflected by the mirror having the focal length f, and is subsequently transformed into parallel light. The light reflected in such a manner forms a sheet beam whose cross section is of an arcuate shape having a radius of f×cos θ and a central angle of 4φ. Accordingly, only a region corresponding to the arc A, shown in FIG. 5, having a radius of f×cos θ and a central angle of 4φ in the illumination target plane is illuminated.

Figure 7:
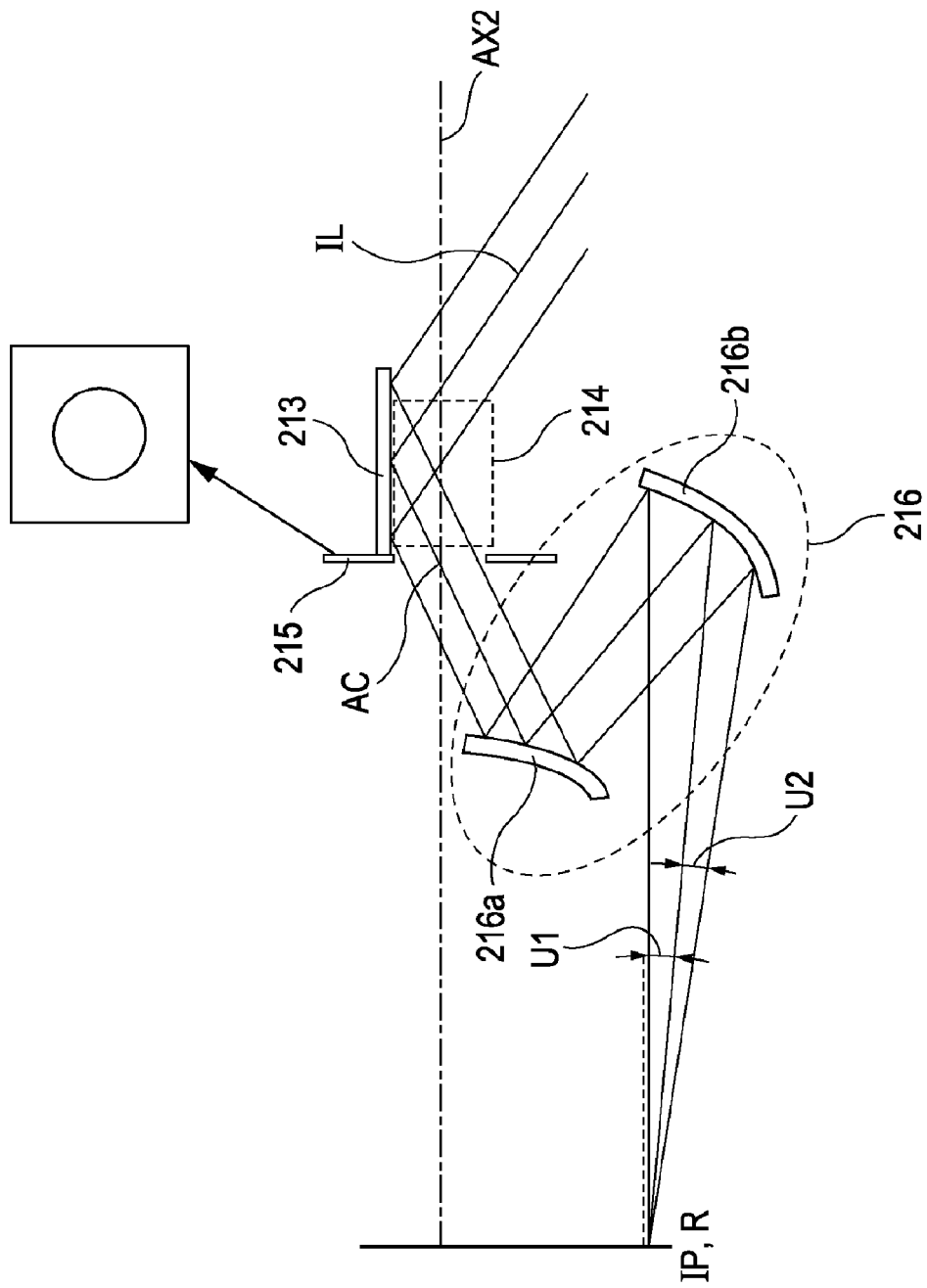
FIG. 7 is a diagram for describing the behavior of illuminating light that is to be incident on the reflective integrator of the first embodiment.

While the above description concerns the behavior of the illuminating light IL incident on a single cylindrical reflection surface, the following description concerns the behavior of the illuminating light IL incident on the entire surface of the reflective integrator 213. FIG. 7 is a schematic cross-sectional view including the reflective integrator 213 on which the illuminating light IL is to be incident. In FIG. 7, an illumination target plane is denoted as IP, which is an equivalent of the mask R.

The second optical unit 216 is a coaxial system having an optical axis AX2 as the central axis of symmetry. The second optical unit 216 is configured in such a manner that a center AC of the opening in the aperture stop 215 and the illumination target plane IP are in an optical relation therebetween described by Fourier transform. The aperture stop 215 is an equivalent of the pupil plane of the illumination target plane IP.

The second optical unit 216 is non-telecentric on the image side. An incident angle U1 of the image-side principal beam from the second optical unit 216 onto the illumination target plane IP is set to be equal to the angle of inclination of the object-side principal beam of the projection optical system 230. The principal beam is inclined in such a manner that the distance between the optical axis AX2, serving as the axis of rotational symmetry, and the principal beam is shorter at a position nearer to the illumination target plane IP. For example, in the first embodiment, the incident angle U1 is set to about 6 degrees. Further, in the second optical unit 216, defocusing on the illumination target plane IP is corrected well, so that a spot diameter of 5 mm or smaller, or desirably 1 mm or smaller, can be obtained.

Incident angles of the principal beams on the convex mirror 216a and the concave mirror 216b constituting the second optical unit 216 are set to small values, specifically 20 degrees or smaller. This reduces defocusing occurring when the light is collected at the illumination target plane IP, compared to the case where the arcuate-transformation optical system includes a single paraboloid-of-revolution mirror. Consequently, the effect of light collection to the arcuate illuminated region can be enhanced. In addition, loss of light due to eclipsing caused by the slit 218 is suppressed, whereby illumination efficiency can be improved.

When the illuminating light IL is reflected by the flat mirror 217 and directed upward to the mask R, the arcuate illuminated region is inverted. In this state, the center of curvature of the arcuate illuminated region is set to coincide with the intersection of the optical axis AX1 of the projection optical system 230 and the mask R. By setting the incident angle U1 as described above, the image-side principal beam of the second optical unit 216 and the object-side principal beam of the projection optical system 230 can be made to coincide with each other on both the upstream side and the downstream side with respect to the mask R.

The angular distribution of the light reflected at each of the cylindrical reflection surfaces 213a constituting the reflective integrator 213 is the same as that in the above-described exemplary case of a single cylindrical reflection surface. Hence, light to be incident on one point in the illumination target plane IP comes from the entirety of a region of the reflective integrator 213 illuminated by the illuminating light IL. When the beam diameter of the illuminating light IL is denoted as D and the focal length of the second optical unit 216 is denoted as f, the divergence angle (the collection NA) U2 of the illuminating light IL is expressed as follows:

$$U2 = D/f$$

Here, in the arcuate illuminated region, uniformity in illuminance can be obtained because beams from a number of the cylindrical reflection surfaces 213a are integrated in a direction along the arc. Thus, efficient and uniform arcuate illumination can be performed.

Figure 8:
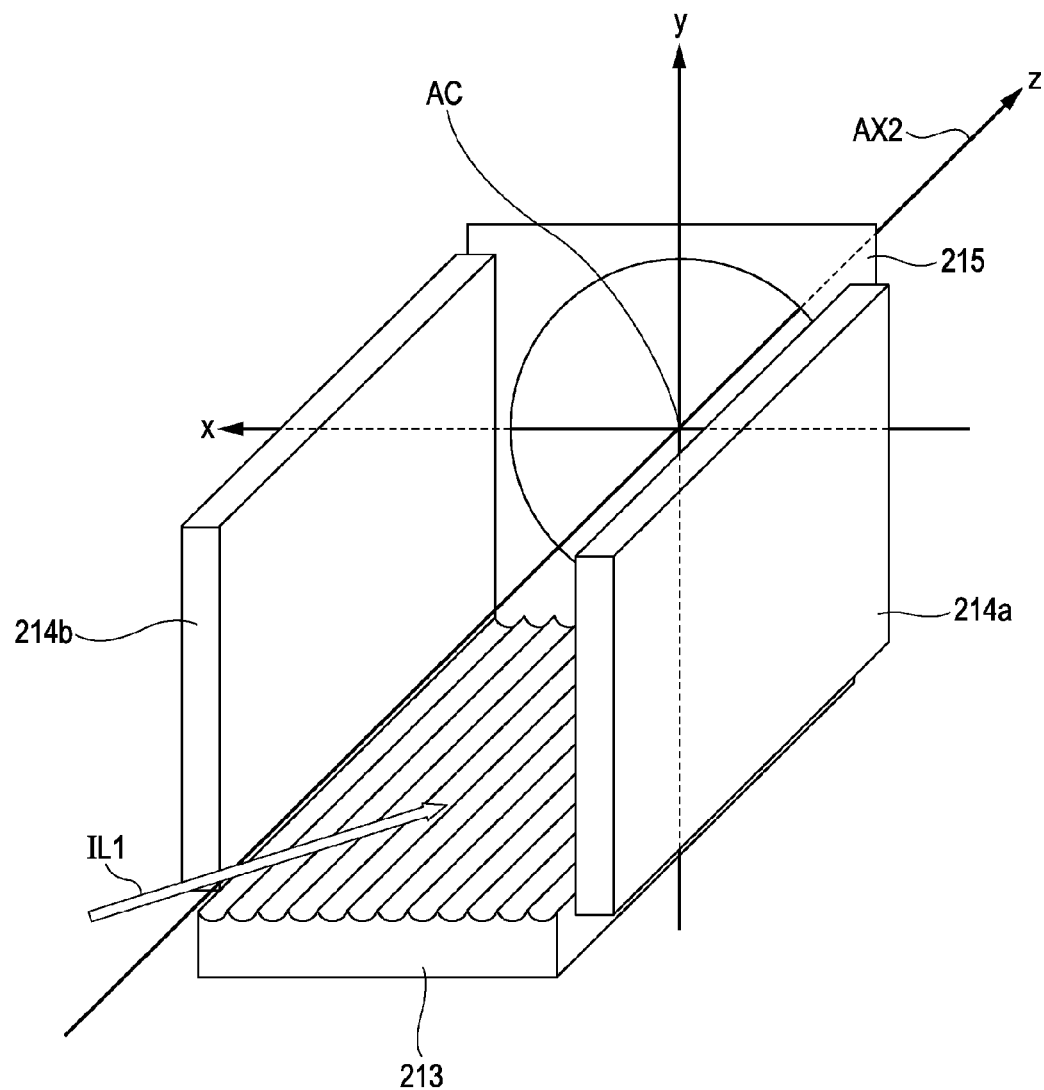
FIG. 8 schematically shows the arrangement of the reflective integrator, an aperture stop, and supplementary mirrors according to the first embodiment.

Next, referring to FIG. 8, the arrangement of the reflective integrator 213 and a pair of the supplementary mirrors 214 provided on opposite sides of the reflective integrator 213 will be described in detail. In FIG. 8, the direction of the principal beam of the illuminating light IL incident on the reflective integrator 213 is denoted as IL1. The principal beam IL1 travels along a y-z plane near the center of the reflective integrator 213. As mentioned above, the center of the aperture stop 215 is denoted as AC and is equivalent to the center of the pupil plane of the second optical unit 216. In an x-y-z coordinate system shown in FIG. 8 having the center AC as the origin, the z axis coincides with the optical axis AX2 of the second optical unit 216.

The supplementary mirrors 214 are a pair of flat mirrors 214a and 214b that are disposed parallel to the generating lines of the cylindrical reflection surfaces of the reflective integrator 213 so as to face each other on opposite sides of a region on the reflective integrator 213 to be illuminated. Although the supplementary mirrors 214 shown in FIG. 8 appear to be disposed at fixed positions, a driving mechanism may be provided for adjusting the interval between the two flat mirrors 214a and 214b in accordance with the shape of the opening in the aperture stop 215.

The aperture stop 215 is disposed on the output side of the reflective integrator 213 in such a manner that the plane of the opening in the aperture stop 215 is perpendicular to the generating lines of the cylindrical reflection surfaces of the reflective integrator 213. The shape of the opening in the aperture stop 215 shown in FIG. 8 is an exemplary circular shape used in a standard illumination mode.

To accommodate slight adjustment of the distribution of effective light sources, the aperture stop 215 may be tilted by 1 to 2 degrees, so as to be not at exact right angles, with respect to the generating lines of the cylindrical reflection surfaces of the reflective integrator 213. Further, to enable adjustment of the distribution of effective light sources and adjustment of the degree of telecentricity, a driving mechanism that adjusts the angle of the aperture stop 215 with respect to the reflective integrator 213 may be added.

With such a configuration in which the aperture stop 215 is disposed on the output side of the reflective integrator 213, the distribution shape of effective light sources observed from arbitrary positions in the arcuate illuminated region can be made uniform. This is because, unlike in the case of Japanese Patent Laid-Open No. 2005-141158, all of the light beams emitted from the first optical unit 211 are incident on the reflective integrator 213 and a part of the light beams reflected by the reflective integrator 213 subsequently passes through the aperture stop 215.

Figure 9A:
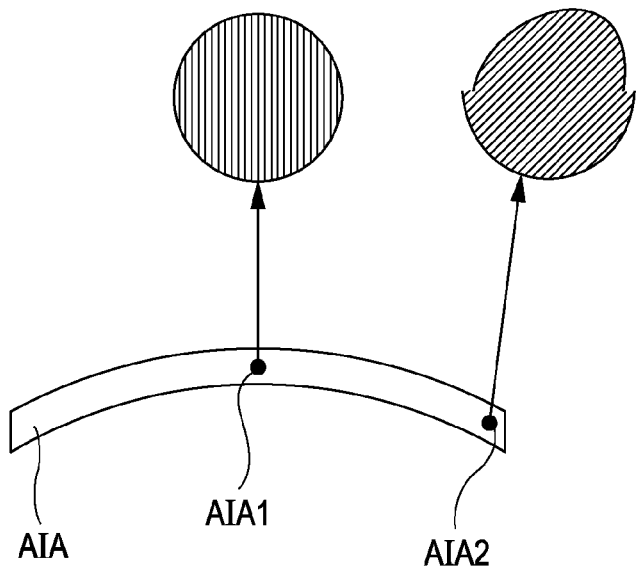
FIG. 9A shows distribution shapes of effective light sources.
Figure 9B:
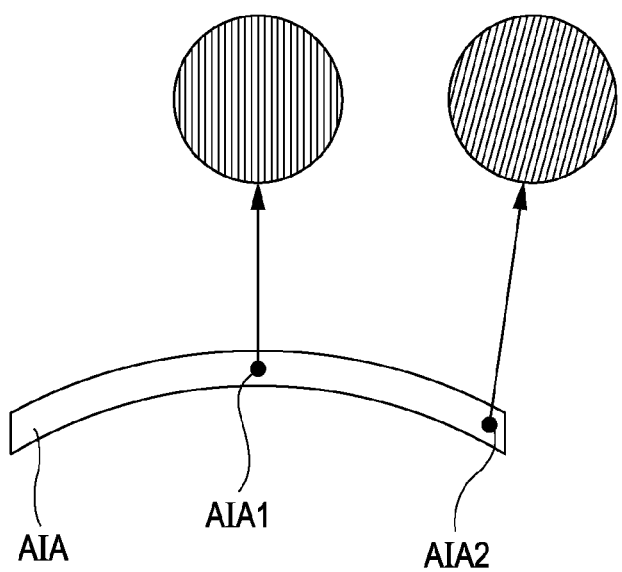
FIG. 9B shows distribution shapes of effective light sources.

FIGS. 9A and 9B show distribution shapes of effective light sources observed from different positions in the arcuate illuminated region. In FIGS. 9A and 9B, the arcuate illuminated region is denoted as AIA, and positions at the center and at an end of the arcuate illuminated region from which the distribution shape of effective light sources is observed are denoted as AIA1 and AIA2, respectively. FIG. 9A shows distribution shapes of effective light sources observed in the case where the aperture stop is disposed as in Japanese Patent Laid-Open No. 2005-141158, and FIG. 9B shows distribution shapes of effective light sources observed in the first embodiment.

The distribution shape of effective light sources observed at an arbitrary point in the illuminated region represents the angular distribution of light beams conically incident thereon with a certain numerical aperture (NA). The fact that the distribution shape of effective light sources varies with position in the illuminated region indicates that the exposure NA is asymmetric. Such asymmetry of the exposure NA may have adverse influence on the resolution.

Referring to FIG. 9A, in the arrangement of the aperture stop disclosed in the known example, the distribution shape of effective light sources still becomes distorted. In contrast, in the first embodiment, as can be seen from FIG. 9B, the distribution shapes of effective light sources at both observation positions are the same. This means that symmetry of the exposure NA has been improved compared to that in the known example.

The slanting lines used for illustrating the distribution shape of effective light sources in FIGS. 9A and 9B indicate that the secondary light sources formed by the reflective integrator 213 are distributed linearly. The interval between the slanting lines depends on the width of the cylindrical reflection surfaces constituting the reflective integrator 213. Therefore, by reducing the width of the cylindrical reflection surfaces relative to the total width of the reflective integrator 213 and thus increasing the number thereof, the interval between the secondary light sources can be reduced, whereby the distribution density of effective light sources can be made high.

Figure 10A:
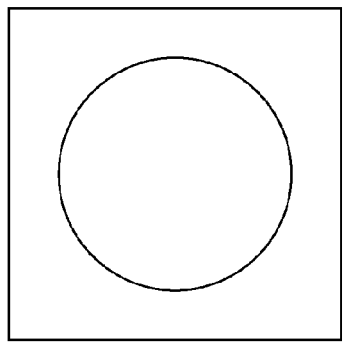
FIG. 10A shows an exemplary pattern for the opening in the aperture stop of the first embodiment.
Figure 10B:
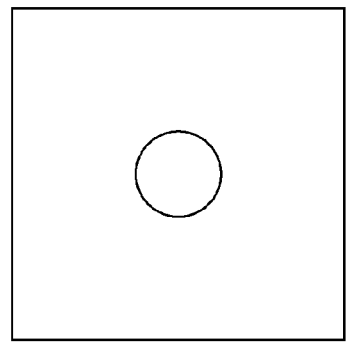
FIG. 10B shows another exemplary pattern for the opening in the aperture stop of the first embodiment.
Figure 10C:
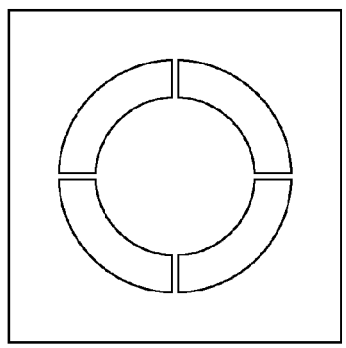
FIG. 10C shows another exemplary pattern for the opening in the aperture stop of the first embodiment.
Figure 10D:
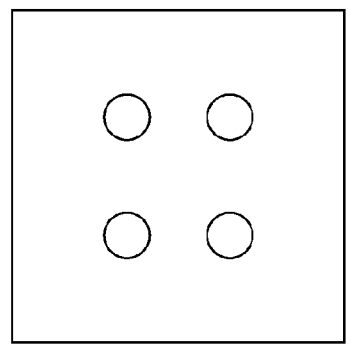
FIG. 10D shows another exemplary pattern for the opening in the aperture stop of the first embodiment.

Next, a method for changing the coherence factor σ and a method for forming different-shaped illumination such as annular illumination will be described. Both methods can be performed by changing the aperture stop 215. The aperture stop 215 and the pupil plane of the projection optical system 230 are conjugate with each other. Accordingly, the shape of the opening in the aperture stop 215 (the pattern through which light is transmitted), corresponds to the distribution shape of light at the pupil plane of the projection optical system 230. FIGS. 10A to 10D show exemplary patterns for the opening in the aperture stop 215. FIG. 10A shows a pattern used in a normal illumination mode with a large σ, FIG. 10B shows a pattern used in the normal illumination mode with a small σ, FIG. 10C shows a pattern used in an annular illumination mode, and FIG. 10D shows a pattern used in a quadrupole illumination mode.

For example, several aperture stops having different opening patterns such as those described above are arranged in a line and are sequentially switched by using an aperture-stop driving mechanism, whereby a desired opening pattern can be selected.

Figure 11:
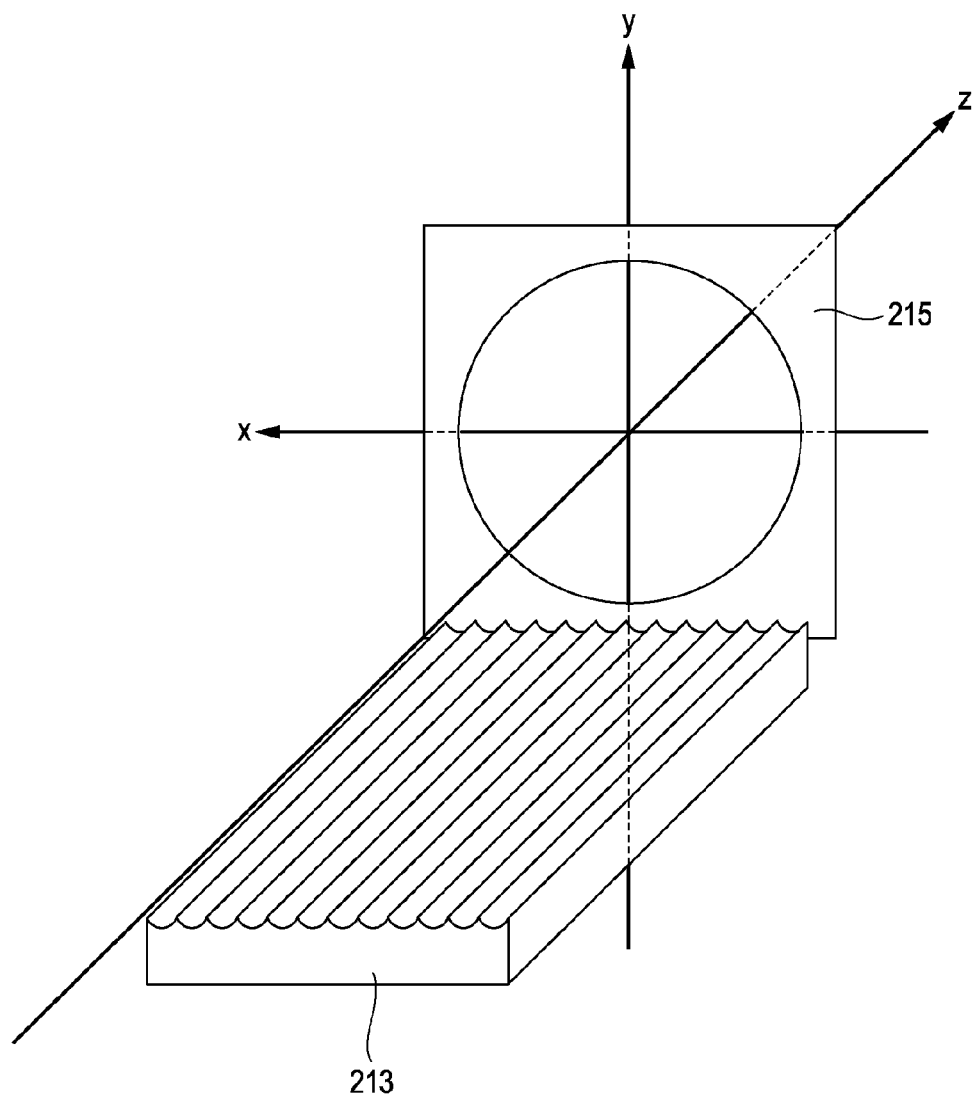
FIG. 11 shows a configuration in which the aperture stop is disposed on the downstream side with respect to the reflective integrator with no supplementary mirrors.

Next, the effect of the supplementary mirrors 214 will be described. In the first embodiment, as described above, the aperture stop 215 is disposed on the output side of the reflective integrator 213 so as to suppress distortion in the distribution shape of effective light sources. The simplest configuration that can be considered for this purpose is shown in FIG. 11, in which the aperture stop 215 is disposed on the downstream side with respect to the reflective integrator 213, with no supplementary mirrors 214.

However, the configuration shown in FIG. 11 has lower efficiency for light utilization than the first embodiment, which will be described below with reference to FIGS. 12 to 14.

Figure 12:
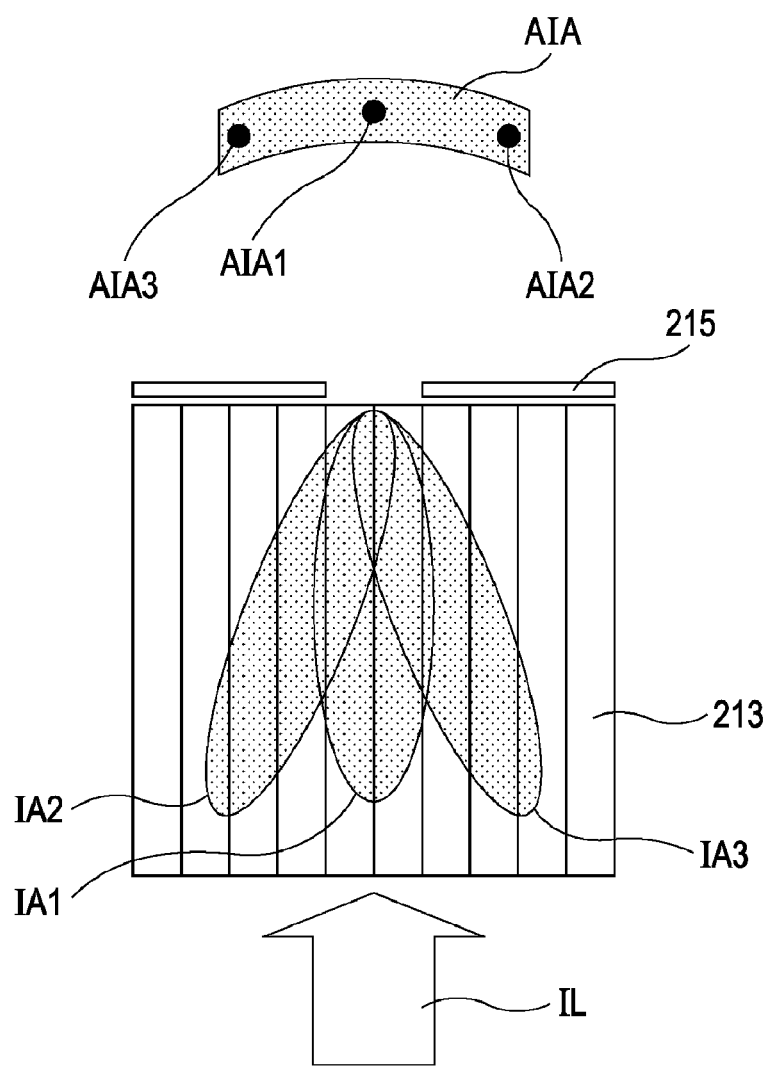
FIG. 12 is a diagram for describing a region on the reflective integrator to be illuminated with illuminating light.

FIG. 12 shows the reflective integrator 213 seen in a direction perpendicular to the reflection surfaces thereof. In FIG. 12, for simpler illustration of features being discussed, the arcuate-transformation optical system (the second optical unit 216) that is disposed between the reflective integrator 213 and the arcuate illuminated region AIA is not shown. The illuminating light IL emitted from the first optical unit 211 illuminates the reflective integrator 213 in a direction indicated in FIG. 12. Regions denoted as IA1, IA2, and IA3 are the regions that are illuminated with the illuminating light IL to obtain perfect-circle distribution shapes for effective light sources at respective observation points AIA1, AIA2, and AIA3 in the arcuate illuminated region. The regions IA1, IA2, and IA3 extend radially with respect to the aperture stop 215.

Notice that there are overlaps between these regions. Referring to FIGS. 13 to 15, the relationship between such overlaps of the regions IA1, IA2, and IA3 and the light beams passing through the opening in the aperture stop 215 will be described.

Figure 13:
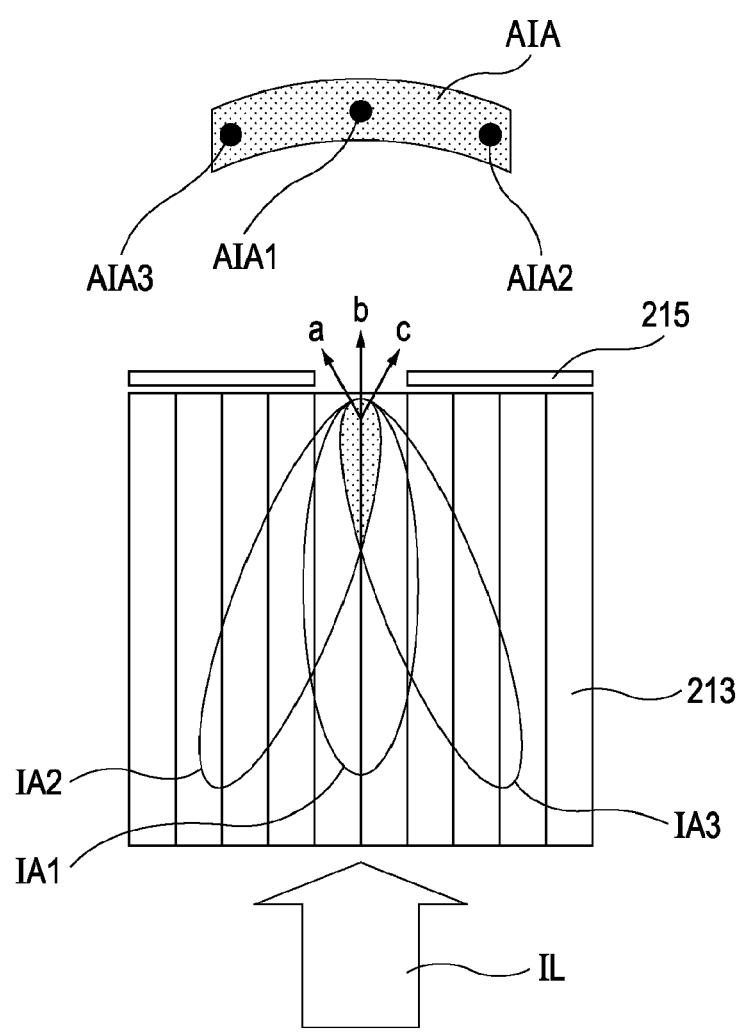
FIG. 13 is a diagram for describing efficiency for utilization of illuminating light.
Figure 14:
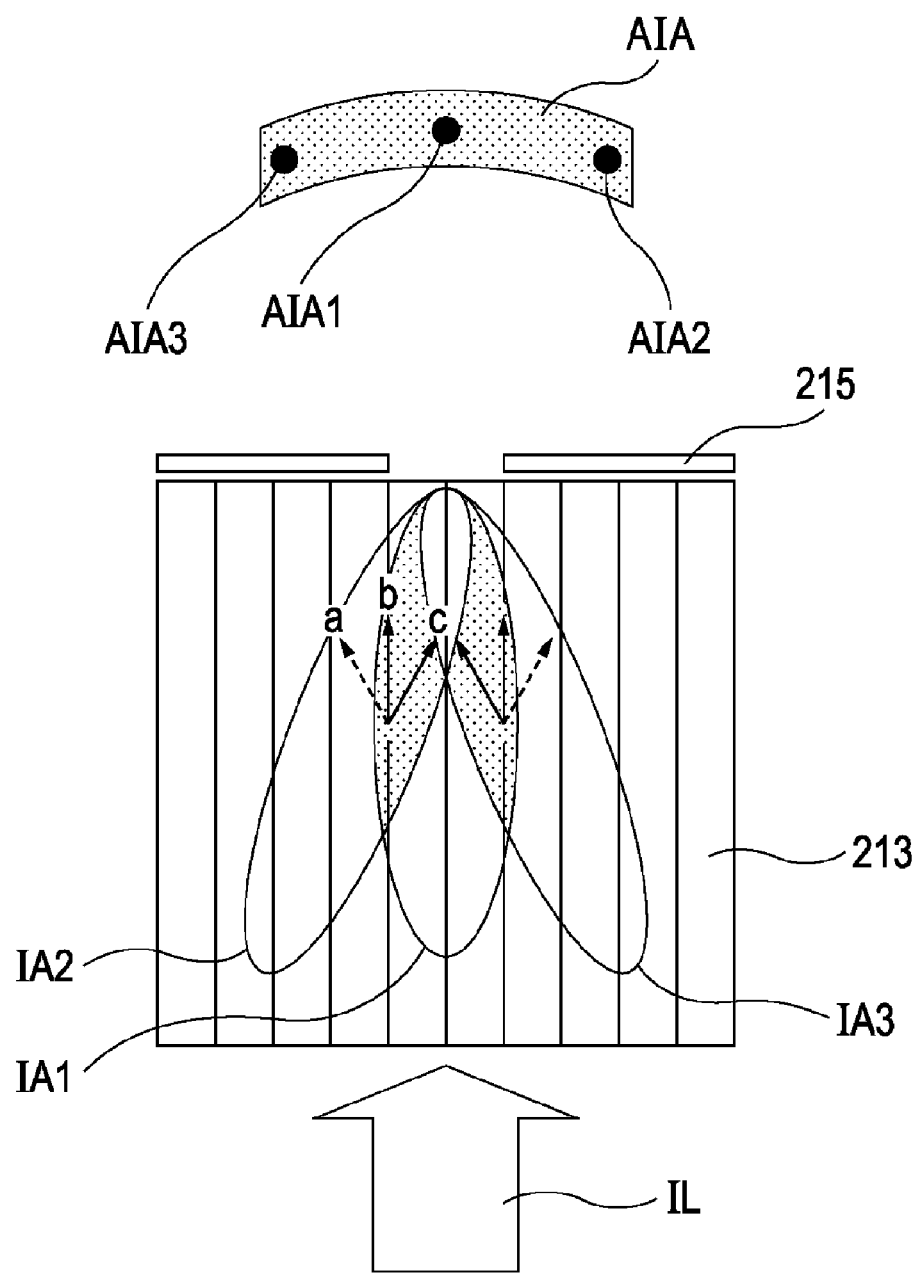
FIG. 14 is another diagram for describing efficiency for utilization of illuminating light.
Figure 15:
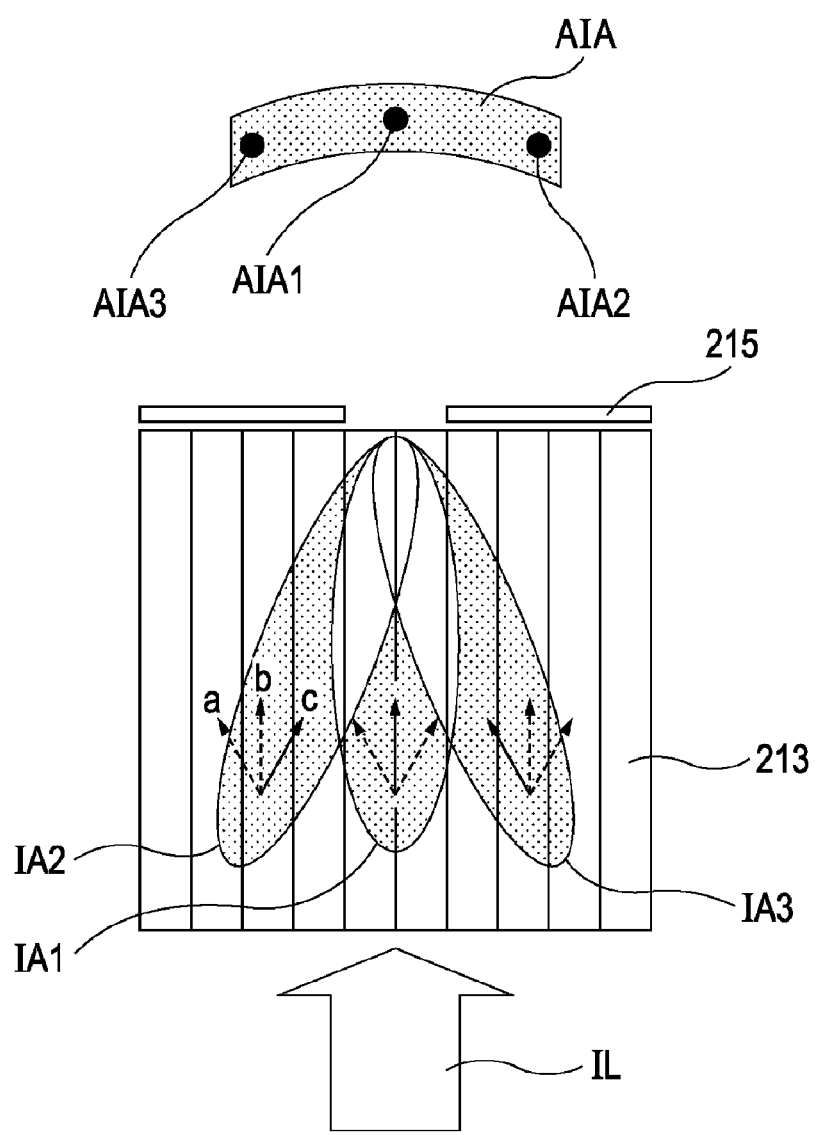
FIG. 15 is another diagram for describing efficiency for utilization of illuminating light.

Arrows in FIGS. 13 to 15 indicate beams of light diffusing from the reflective integrator 213. In particular, representative beams in three directions are denoted as a, b, and c, respectively. The beams a, b, and c are shown as solid lines when they are to be utilized as illuminating light in the downstream system, but as broken lines when they are to be eclipsed by the aperture stop 215 and not utilized as illuminating light.

FIG. 13 focuses on an overlap between all of the regions IA1 to IA3 near the aperture stop 215. It can be seen that the beams diffusing from this overlap contribute to formation of the distribution shape of effective light sources at all of the observation points AIA1 to AIA3. In other words, the beams a to c emitted from this overlap are fully utilized as illuminating light.

In contrast, referring to FIG. 14, at some distance from the aperture stop 215 where two of the regions IA1 to IA3 overlap each other, some of the diffusing light from the reflective integrator 213 is eclipsed by the aperture stop 215 and does not contribute to illumination of the target plane. Specifically, at a point indicated in FIG. 14 where only the regions IA1 and IA2 overlap each other, the beams b and c are utilized as illuminating light, but the beam a is eclipsed by the aperture stop 215.

Referring to FIG. 15, at a farther distance from the aperture stop 215 where there is no overlap between the regions IA1 to IA3, a large portion of the diffusing light is eclipsed by the aperture stop 215, and only a small portion of the light is utilized as illuminating light. Specifically, at a point in the region IA2 indicated in FIG. 15, only the beam c is utilized as illuminating light, but the beams a and b are eclipsed by the aperture stop 215. Likewise, at respective points in the regions IA1 and IA3, only one of the beams a, b, and c is utilized as illuminating light.

To summarize, although a configuration such as the one shown in FIG. 11 is effective for suppressing distortion in the distribution shape of effective light sources, such a configuration requires further improvement in terms of efficiency for light utilization. Compared to the configuration shown in FIG. 11, the first embodiment, which includes a pair of the supplementary mirrors 214 disposed on opposite sides of the reflective integrator 213, has higher efficiency for light utilization.

Figure 16:
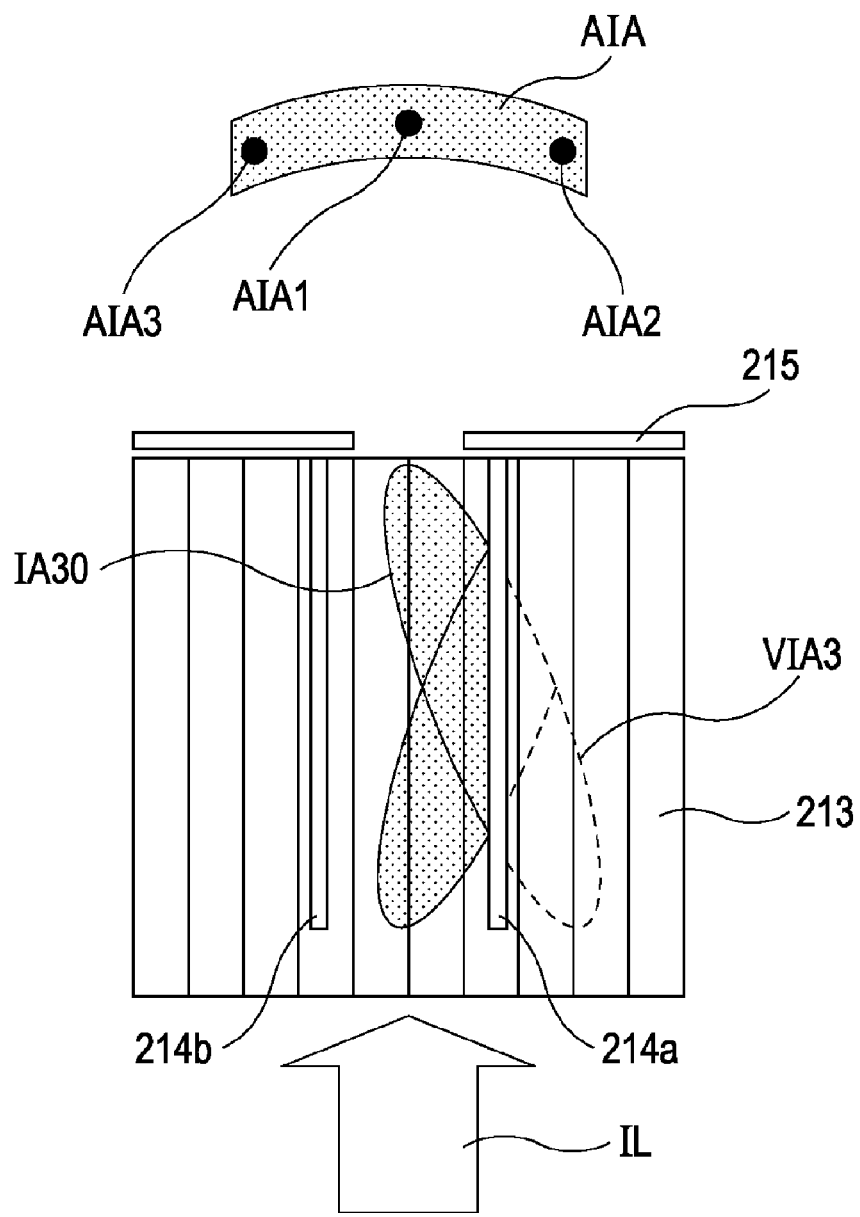
FIG. 16 is a diagram for describing the effect of the supplementary mirrors.
Figure 17:
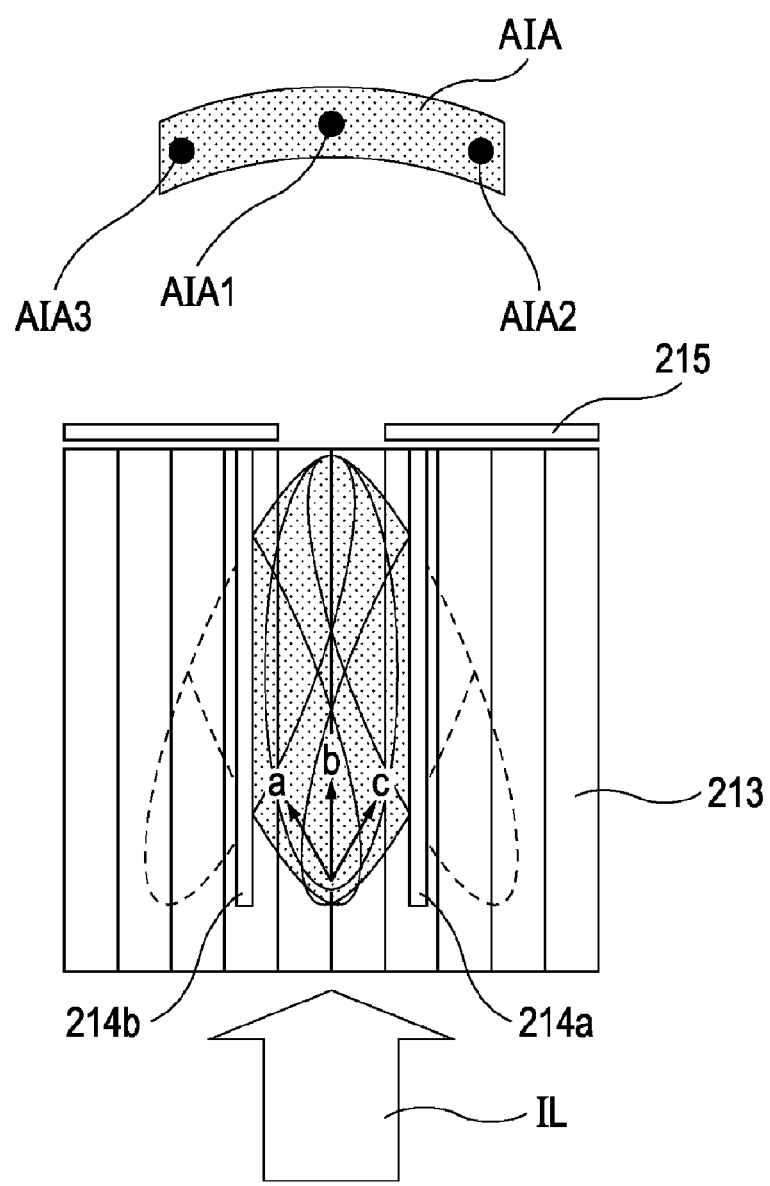
FIG. 17 is another diagram for describing the effect of the supplementary mirrors.

FIGS. 16 and 17 show the effect of the supplementary mirrors 214. A region VIA3 enclosed by the broken lines indicates a region that is illuminated with the illuminating light IL to obtain a perfect-circle distribution shape for effective light sources at the observation point AIA3 in the case of having no supplementary mirrors 214, such as in the configuration shown in FIG. 12. The region VIA3 corresponds to the region IA3 in FIG. 12. In FIG. 16, with the presence of the flat mirror 214a, the region that is illuminated with the illuminating light IL to obtain a perfect-circle distribution shape for effective light sources at the observation point AIA3 is actually shaped as a region IA30 enclosed by the solid lines. Thus, with the flat mirror 214a, instead of a shape extending radially with respect to the aperture stop 215 such as the one shown in FIG. 12, a shape obtained by folding the radially extending shape at the flat mirror 214a can be taken as a region to be illuminated to suppress distortion in the effective light source shape.

This also applies to the observation point AIA2. Regions that are illuminated to obtain perfect-circle distribution shapes for effective light sources at the respective observation points AIA1 to AIA3 reside between the supplementary mirrors 214, as shown in FIG. 17. This shows that provision of the supplementary mirrors 214 makes the region on the reflective integrator 213 to be illuminated with the illuminating light IL smaller than that in the configuration shown in FIG. 12 not having the supplementary mirrors 214. Moreover, if the beams a and c shown in FIG. 17 are put in the configuration shown in FIG. 12 not having the supplementary mirrors 214, the beams a and c would be eclipsed by the aperture stop 215 and not utilized as illuminating light in the downstream system. However, in the first embodiment, the beams a and c are not eclipsed by the aperture stop 215 because of the presence of the supplementary mirrors 214, and can be utilized as illuminating light. Consequently, the number of beams included in the illuminating light IL to be utilized for illuminating the target plane increases. This is a great advantage in efficiently illuminating an arcuate region.

Thus, by disposing a pair of the flat mirrors 214a and 214b along the generating lines of the cylindrical reflection surfaces so as to face each other with a region to be illuminated with the illuminating light IL, i.e., a plurality of linear light sources, residing therebetween, efficiency in illuminating the target plane can be improved. The interval between the flat mirrors 214a and 214b can be made a little larger than or the same as the outermost diameter of the opening in the aperture stop 215, from the viewpoint of efficiency for light utilization. Therefore, when the aperture stops 215 having openings of different shapes such as those shown in FIGS. 10A to 10D are switchingly used, the interval between the flat mirrors 214a and 214b serving as the supplementary mirrors 214 may be adjusted according to the shape of the opening to be used.

Second Embodiment

An exposure apparatus according to a second embodiment will now be described. The second embodiment differs from the first embodiment in the configuration of the reflective integrator and the shape of the opening in the aperture stop. Hence, detailed description of other components included in the exposure apparatus are omitted.

While the first embodiment concerns a configuration in which the reflective integrator is constituted by a single member having a plurality of cylindrical reflection surfaces, the second embodiment concerns a configuration in which the reflective integrator is constituted by a plurality of integrator segments each having a plurality of cylindrical reflection surfaces. Also with such a reflective integrator, distortion in the distribution shape of effective light sources can be suppressed by disposing an aperture stop on the output side of the reflective integrator. Further, by providing supplementary mirrors on opposite sides of the reflective integrator, highly efficient illumination can be realized.

Figure 18:
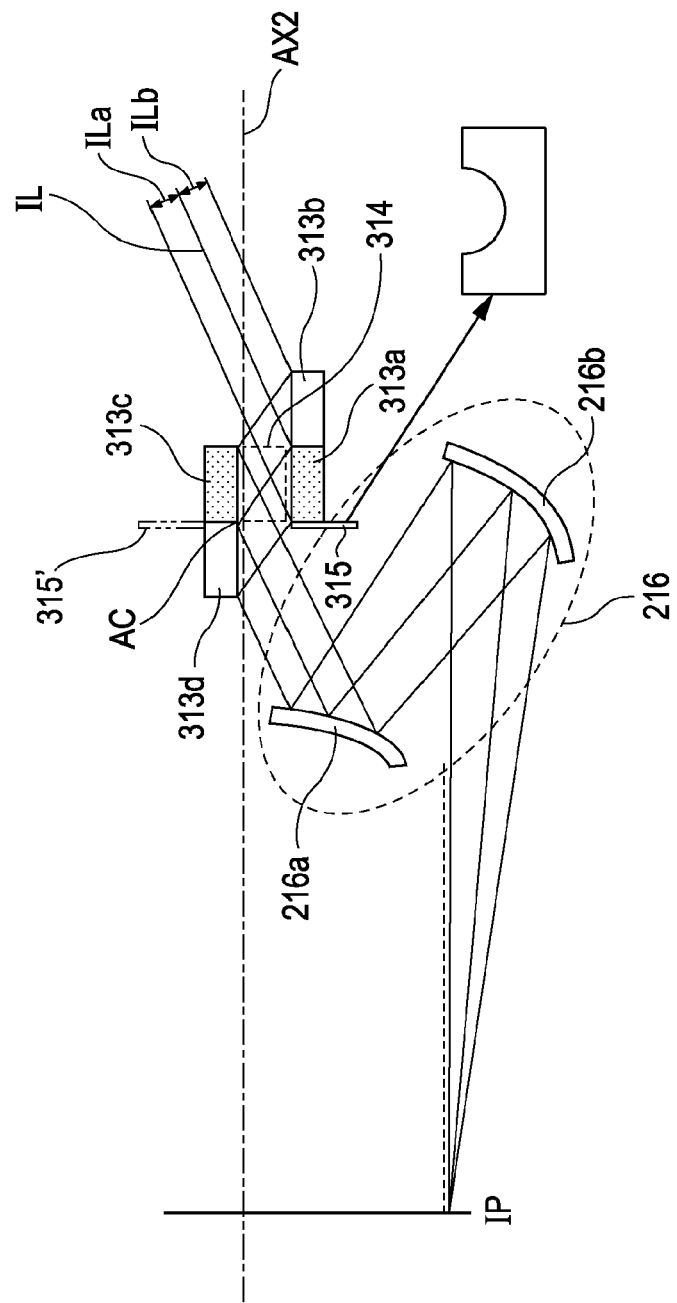
FIG. 18 is a diagram for describing the behavior of illuminating light that is to be incident on a reflective integrator of a second embodiment of the present invention.

FIG. 18 schematically shows a reflective integrator 313, supplementary mirrors 314, and an aperture stop 315, which all are components according to the second embodiment, and the second optical unit 216. In FIG. 18, members denoted as 313a, 313b, 313c, and 313d constitute the reflective integrator 313. The members 313a and 313c are integrator segments each having a plurality of cylindrical reflection surfaces, and members 313b and 313d are flat mirror segments adjoining the integrator segments 313a and 313c, respectively. As can be seen from FIG. 18, the aperture stop 315 has a semicircular opening. The supplementary mirrors 314 are a pair of flat mirrors 314a, 314b disposed so as to face each other on opposite end faces of the integrator segments 313a and 313c, the end faces being parallel to the generating lines of the cylindrical reflection surfaces constituting the integrator segments 313a and 313c.

The convex mirror 216a and the concave mirror 216b are members constituting the second optical unit 216. The second optical unit 216 is a coaxial system having the optical axis AX2 as the central axis of symmetry, and functions basically in the same manner as in the first embodiment. In particular, the second optical unit 216 is configured in such a manner that a point AC of the aperture stop 315 and the illumination target plane IP are in an optical relation therebetween described by Fourier transform. Hence, the point AC is an equivalent of the center of the pupil plane of the second optical unit 216.

Figure 19:
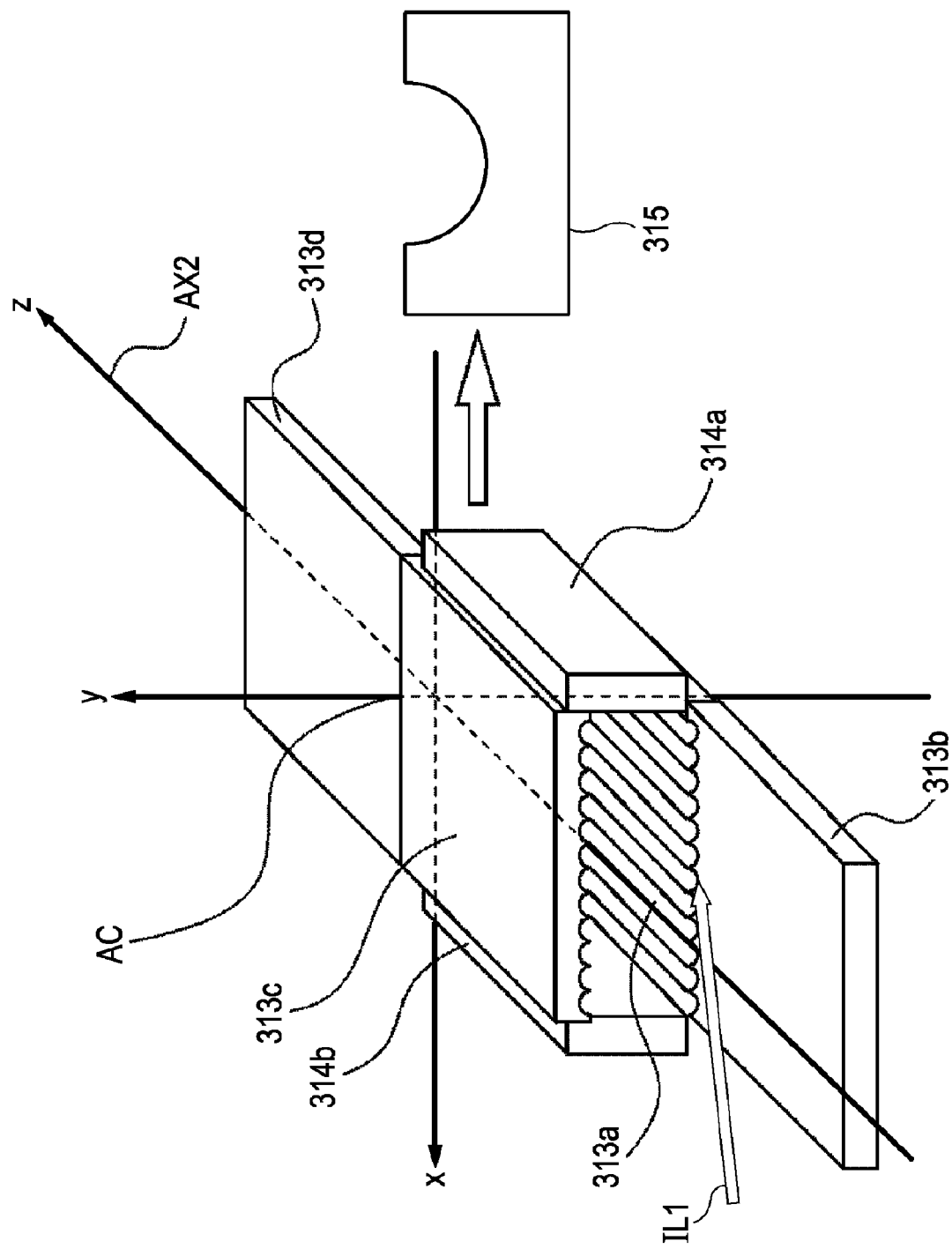
FIG. 19 schematically shows the arrangement of the reflective integrator, an aperture stop, and supplementary mirrors according to the second embodiment.

FIG. 19 schematically shows the arrangement of the aperture stop 315 and the reflective integrator 313. The aperture stop 315 is disposed near the boundary between the integrator segment 313c and the flat mirror segment 313d in such a manner that the plane of the opening in the aperture stop 315 is perpendicular to the generating lines of the cylindrical reflection surfaces. The plane of the opening in the aperture stop 315 may be tilted by 1 to 2 degrees from perpendicular, so as to accommodate slight adjustment of the distribution of effective light sources. The shape of the opening in the aperture stop 315 shown in FIG. 19 is an exemplary shape used in a standard illumination mode. Typically, an aperture stop provided at the pupil plane has a circular opening. In the second embodiment, however, the aperture stop 315 has a semicircular opening as shown in FIG. 19. Further, as described below, aperture stops to be used in illumination modes for other shapes, such as an annular shape and a quadrupole shape, each have an opening that matches a shape obtained by halving the corresponding distributional shape of effective light sources with respect to the axis of symmetry thereof. Further detail regarding FIG. 19 is provided next with reference to FIG. 18.

Referring to FIG. 18, the manner of regulating beams of light by using the above-described aperture stop 315 will be described. Now, the case where the illuminating light IL that is substantially parallel is incident on the integrator segment 313a and the flat mirror segment 313b at a relatively large incident angle (70 degrees, for example) will be considered. Illuminating light ILa, which is the upper portion of the illuminating light IL in FIG. 18, illuminates the integrator segment 313a. The integrator segment 313a forms linear secondary light sources when receiving the illuminating light ILa. The light diffusing from the secondary light sources passes through the semicircular opening in the aperture stop 315 disposed immediately downstream with respect to the integrator segment 313a. On the other hand, illuminating light ILb, which is the lower portion of the illuminating light IL, illuminates the flat mirror segment 313b. The illuminating light ILb that has been deflected by the flat mirror segment 313b illuminates the integrator segment 313c. The integrator segment 313c also forms linear secondary light sources. The light diffusing from the secondary light sources passes through the semicircular opening in the aperture stop 315 disposed immediately downstream with respect to the integrator segment 313c. When viewed from the second optical unit 216, the illuminating light ILb appears to pass through the semicircular opening in the aperture stop 315 after being incident on the integrator segment 313c. On the other hand, the illuminating light ILa appears to pass through the semicircular opening in a mirror image 315' of the aperture stop 315 after being incident on the integrator segment 313a.

Although the opening in the aperture stop 315 is of a semicircular shape, the light diffusing from all of the secondary light sources can be caused to pass the opening in the aperture stop 315 by configuring the reflective integrator 313 and appropriately arranging the aperture stop 315 as described in the second embodiment. Consequently, it is regarded that the configuration of the second embodiment behaves in a manner equivalent to that in the first embodiment in which the light diffusing from the secondary light sources passes through a circular opening. Hence, also in the illumination optical system according to the second embodiment, effective light sources having the same distribution shape can be observed from any position on the illumination target plane.

Further, by disposing the supplementary mirrors on opposite sides of the integrator segments 313a and 313c so as to face each other along the generating lines of the cylindrical reflection surfaces of the integrator segments 313a and 313c, with a plurality of secondary light sources residing therebetween, highly efficient illumination can be realized.

Figure 20A:
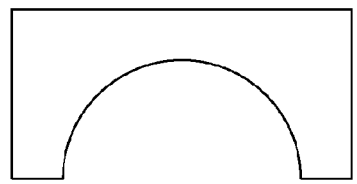
FIG. 20A shows an exemplary pattern for the opening in the aperture stop of the second embodiment.
Figure 20B:
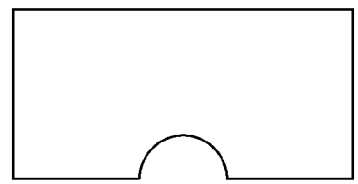
FIG. 20B shows another exemplary pattern for the opening in the aperture stop of the second embodiment.
Figure 20C:
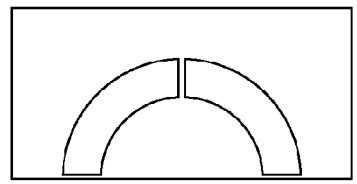
FIG. 20C shows another exemplary pattern for the opening in the aperture stop of the second embodiment.
Figure 20D:
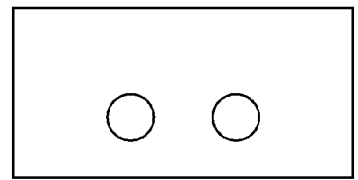
FIG. 20D shows another exemplary pattern for the opening in the aperture stop of the second embodiment.

Also in the second embodiment, the coherence factor σ can be changed and different-shaped illumination such as annular illumination can be performed by changing the aperture stop 315. FIGS. 20A to 20D show exemplary patterns for the opening in the aperture stop 315 according to the second embodiment. FIG. 20A shows a pattern used in a normal illumination mode with a large σ, FIG. 20B shows a pattern used in the normal illumination mode with a small σ, FIG. 20C shows a pattern used in an annular illumination mode, and FIG. 20D shows a pattern used in a quadrupole illumination mode. It is understood that each of the patterns becomes a pattern based on a typical circle when turned over symmetrically with respect to the bottom line thereof.

Figure 21A:
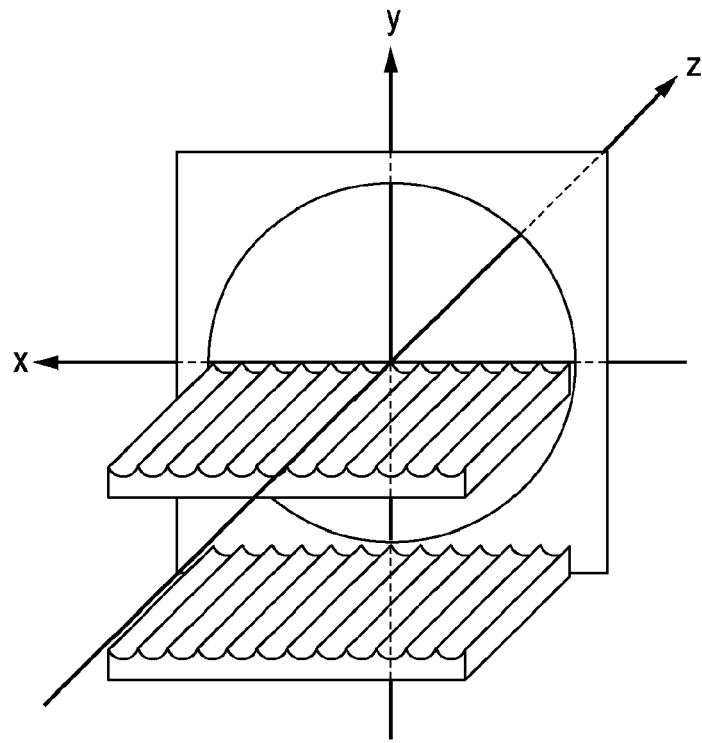
FIG. 21A schematically shows the arrangement of the reflective integrator and the aperture stop in another exemplary case.
Figure 21B:
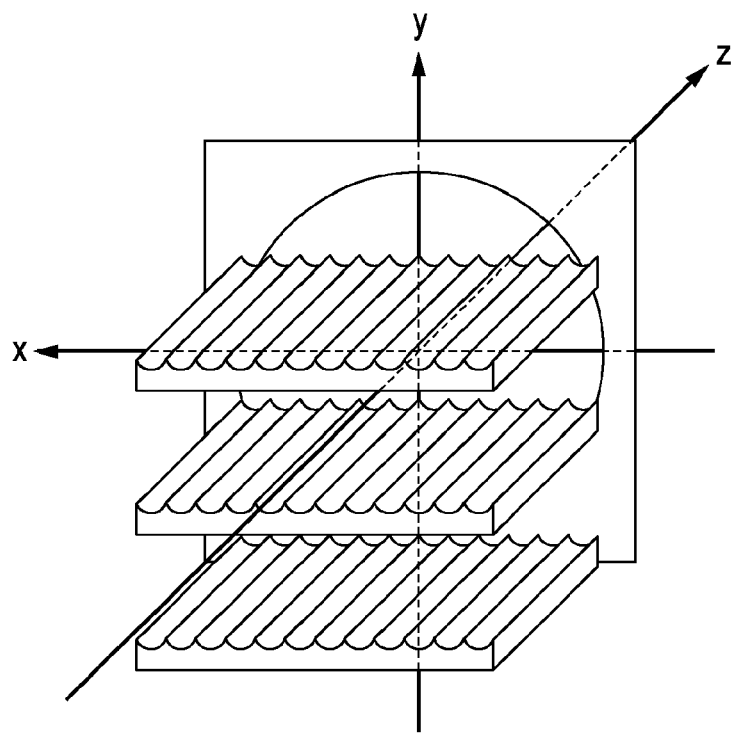
FIG. 21B schematically shows the arrangement of the reflective integrator and the aperture stop in another exemplary case.
Figure 22:
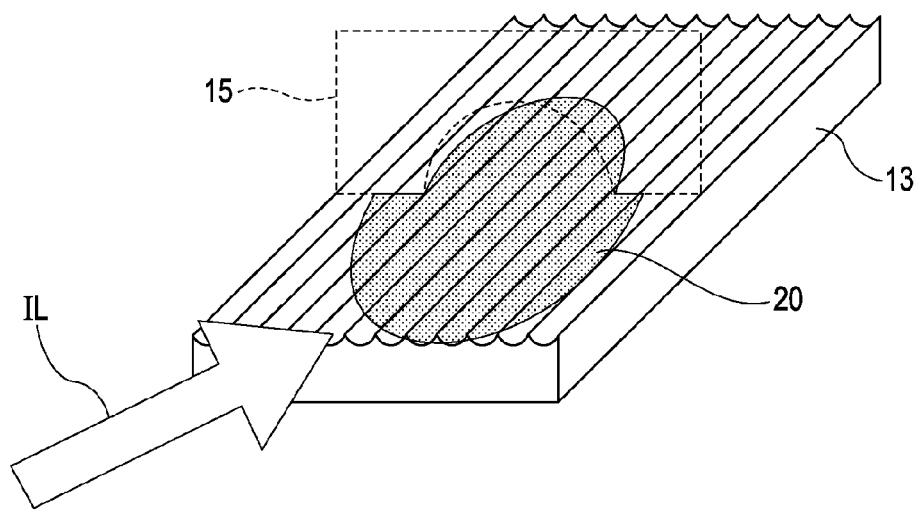
FIG. 22 is a schematic perspective view showing the arrangement of a reflective integrator and an aperture stop in a known example.
Figure 23:
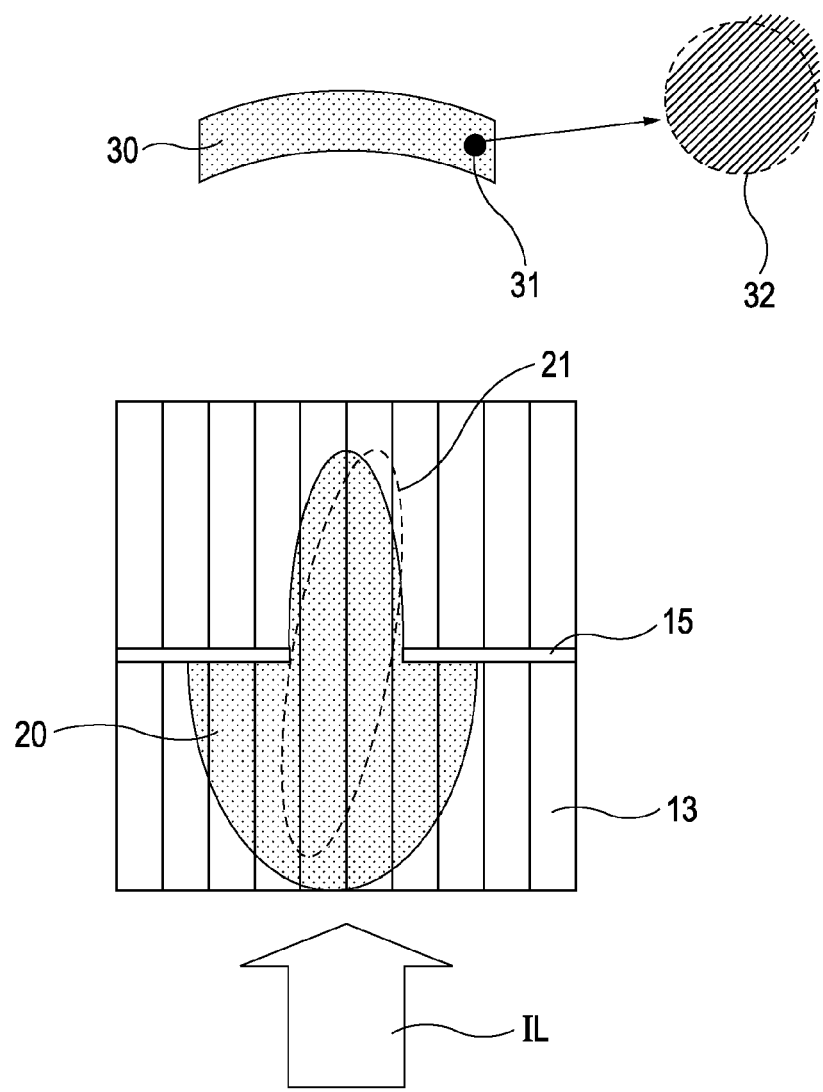
FIG. 23 is a top view of the reflective integrator in the known example.

While the second embodiment concerns a configuration in which two integrator segments are disposed so as to face each other, a configuration in which two integrator segments do not face each other can also be considered. For example, as shown in FIGS. 21A and 21B, a plurality of integrator segments parallel to each other may be disposed on the incidence side of an aperture stop, with the reflection surfaces of those integrator segments facing the same direction. FIG. 21A shows a configuration that includes two integrator segments, and FIG. 21B shows a configuration that includes three integrator segments. When the integrator segments are disposed parallel to each other as described above, the opening in the aperture stop in each of the configurations will be of a normal circular shape as in the first embodiment. Also in the configurations shown in FIGS. 21A and 21B, by providing supplementary mirrors on opposite sides of the reflective integrator, efficiency for utilization of illuminating light can be improved.

In this specification, when arrangement of the aperture stop is described as being disposed "perpendicularly" to the generating lines of the cylindrical reflection surfaces, the aperture stop may be tilted by 1 to 2 degrees from perpendicular.

In addition, devices such as semiconductor integrated circuit devices and liquid crystal display devices can be manufactured by performing a step for performing exposure on a substrate (a wafer, a glass plate, or the like), onto which a photosensitive agent is applied, by using an exposure apparatus according to any of the above-described embodiments, a step for developing the substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions. For example, while the embodiments concern configurations using EUV light, the present invention can also be applied to configurations including a light source using light of the vacuum ultraviolet or X-beam region.

This application claims the benefit of Japanese Patent Application No. 2007-195929 filed Jul. 27, 2007, which is hereby incorporated by reference herein in its entirety.

What is claimed is:

1. An illumination optical system comprising:
    a first optical unit that collects light emitted from a light source;
    a reflective integrator that has a plurality of cylindrical reflection surfaces, whose generating lines are oriented in a uniform direction, and forms a plurality of linear light sources by using the light emitted from the first optical unit;

a pair of flat mirrors that are disposed parallel to the generating lines so as to face each other with the plurality of linear light sources residing therebetween;

an aperture stop that is disposed perpendicular to the generating lines and has an opening for allowing the light emitted from the plurality of linear light sources to pass therethrough; and a second optical unit that integrates beams of the light emitted from the plurality of linear light sources that have passed through the opening one on top of another in an illumination target plane.

2. The illumination optical system according to claim 1, wherein the reflective integrator has a plurality of integrator segments each having a plurality of the cylindrical reflection surfaces, the plurality of integrator segments disposed on an incident side of the aperture stop and parallel to each other in a direction perpendicular to the generating lines so that a portion of the light emitted from the first optical unit is incident on each of the plurality of integrator segments.

3. The illumination optical system according to claim 1, wherein the first optical unit transforms the light emitted from the light source into parallel light and guides the parallel light to the reflective integrator.

4. The illumination optical system according to claim 1, wherein a shape of the opening in the aperture stop is changeable and the interval between the pair of flat mirrors is changed in accordance with the shape of the opening.

5. An exposure apparatus comprising:

a mask stage on which a mask is to be mounted;

a wafer stage on which a wafer is to be mounted;

an illumination optical system according to claim 1 that illuminates the mask placed in the illumination target plane; and a projection optical system that projects a pattern formed on the mask onto the wafer.

6. A device manufacturing method comprising:

applying a resist onto a wafer;

performing exposure using the exposure apparatus according to claim 5 so that a pattern formed on a mask is transferred to the wafer; and developing the wafer subjected to exposure.

* * * * *